United States Patent
Boucher (10) Patent No.: US 6,168,832 B1
(45) Date of Patent: Jan. 2, 2001

(54) THREE-DIMENSIONAL MASKING METHOD FOR CONTROL OF COATING THICKNESS

(75) Inventor: A. Neil Boucher, Ashby Parva (GB)

(73) Assignee: Coherent, Inc., Santa Clara, CA (US)

( * ) Notice: Under 35 U.S.C. 154(b), the term of this patent shall be extended for 0 days.

(21) Appl. No.: 09/233,903

(22) Filed: Jan. 20, 1999

Related U.S. Application Data (63) Continuation-in-part of application No. 08/891,750, filed on Jul. 14, 1997, now Pat. No. 5,993,904.

(30) Foreign Application Priority Data

Jan. 20, 1997 (GB) .................................. 9701114

(51) Int. Cl.[7] .................................................. C23C 14/04
(52) U.S. Cl. ............................... 427/248.1; 427/255.5; 427/282; 204/192.1; 204/192.12; 204/298.11; 204/298.23
(58) Field of Search ..................... 427/162, 166, 427/248.1, 255.5, 282, 585, 587; 204/192.1, 192.11, 192.12, 298.23, 298.27, 298.28

(56) References Cited

U.S. PATENT DOCUMENTS

| | | | |
|---|---|---|---|
| 3,442,572 | 5/1969 | Illsley et al. ........................ | 350/166 |
| 3,503,781 | 3/1970 | Forman et al. ...................... | 117/38 |
| 3,773,541 | 11/1973 | Ng et al. ............................. | 117/33.3 |
| 4,013,502 | 3/1977 | Staples ................................. | 156/608 |
| 4,391,034 | 7/1983 | Stuby .................................. | 29/579 |
| 4,449,478 | 5/1984 | Kraus .................................. | 118/720 |
| 4,704,306 | 11/1987 | Nakamura ........................... | 427/100 |
| 4,776,868 | 10/1988 | Trotter, Jr. et al. ................ | 65/18.2 |
| 4,800,840 | 1/1989 | Colton ................................ | 118/721 |
| 4,988,424 | 1/1991 | Woodward et al. ............... | 204/192.29 |
| 5,223,108 | 6/1993 | Hurwitt .............................. | 204/192.12 |
| 5,330,628 | * 7/1994 | Demaray et al. . | |
| 5,338,424 | 8/1994 | Drimer et al. ..................... | 204/298.11 |
| 5,380,558 | 1/1995 | Fujino ................................ | 427/255.5 |
| 5,389,397 | 2/1995 | Brennesholtz ...................... | 427/69 |
| 5,415,753 | * 5/1995 | Hurwitt et al. . | |
| 5,529,670 | 6/1996 | Ryan et al. ........................ | 204/192.15 |
| 5,650,052 | * 7/1997 | Edelstein et al. . | |
| 5,885,425 | * 3/1999 | Hsieh et al. . | |
| 5,948,468 | * 9/1999 | Sweatt et al. . | |

FOREIGN PATENT DOCUMENTS

| | | | |
|---|---|---|---|
| 0 118 576 | 9/1984 | (EP) ............................ | C23C 13/06 |
| 0 512 296 A1 | 11/1992 | (EP) ............................ | H01L 21/90 |
| 2619226 | * 2/1989 | (FR) . | |
| 87 11309 | 2/1989 | (FR) ............................ | G02B 1/10 |
| 1 481 474 | 7/1977 | (GB) ............................ | C23C 13/02 |
| 60181264 | 9/1985 | (JP) ............................. | C23C 14/24 |
| 5-182962 | * 7/1993 | (JP) . | |
| WO 93/13542 | 7/1993 | (WO) ........................... | H01J 37/34 |
| WO 95/03436 | 2/1995 | (WO) ........................... | C23C 14/04 |

OTHER PUBLICATIONS

J.R. Kurdock & R.R. Austin, "Correction of Optical Elements by the Addition of Evaporated Films", *Physics of Thin Films*, vol. 10, pp. 261–308, Academic Press (1978).

* cited by examiner

Primary Examiner—Timothy Meeks
(74) Attorney, Agent, or Firm—Limbach & Limbach L.L.P.

(57) ABSTRACT

A method of vacuum depositing a layer or layers on a substrate includes controlling thickness distribution of the layer or layers over the substrate by a three-dimensional mask (64) located between the substrate 48 and a vapor source (56). In one example a circular mask (64R) is divided by radially-extending spaced-apart walls (90) dividing the mask into radially-extending apertures (98) for allowing passage of gaseous coating material through the mask from a source to the substrate. The mask and substrate are rotated with respect to the source. The vapor transmission of the apertures is directly related to the height and spacing of the walls. The height and/or angular-spacing of the walls is varied over the mask for spatially varying thickness of the layer or layers over the substrate.

9 Claims, 9 Drawing Sheets

THREE-DIMENSIONAL MASKING METHOD FOR CONTROL OF COATING THICKNESS

REFERENCE TO PRIOR U.S. APPLICATIONS

This application is a continuation-in-part of application Ser. No. 8/891,750, filed Jul. 14, 1997, now U.S. Pat. No. 5,993,904, issued Nov. 30, 1999.

TECHNICAL FIELD OF THE INVENTION

The present invention relates in general to methods of controlling layer thickness in the vacuum deposition of coatings including one or more coating layers. It relates in particular to a method wherein coating layer thickness on a substrate is controlled by a three-dimensional mask located between the substrate and a vapor source, the mask having a vapor acceptance angle which is spatially varied over the mask area.

DISCUSSION OF BACKGROUND ART

Prior art methods for control of spatial distribution of layer thickness in vacuum deposited coatings have been devised primarily with one of two goals. One of these goals is the formation of a layer or layers of uniform thickness on a substrate. The other is the forming a layer or layers the thickness of which varies in a predetermined manner over the surface of a substrate.

One of the earliest, and still-used, methods of achieving layer thickness uniformity involved rotating a flat, or slightly dome-shaped, substrate holder, to which one or more substrates could be attached, about a central axis offset from the a source of vapor for forming the layer. Using this method it is possible to achieve layer thickness over the substrate holder which is approximately uniform, the extent of the uniformity determined by primarily by the ratio of the offset of the rotation axis to the height of the substrate holder above the vapor source. The smaller the substrate holder relative to the height above the source, the greater the uniformity is achievable. This method has been embellished by additionally providing rotation of the substrate holder about an axis offset from the center of the substrate holder, such that the substrate holder is doubly rotated in a "planetary" fashion relative to the source. Any sub-area of the substrate holder receives vapor from the source at a range of incidence angles during the course of deposition. One important advantage of this "planetary" method is that non-uniformity of vapor output from the vapor source is compensated for. The planetary method, may be adapted for applying an approximately uniform thickness layer to a substrate which is flat, or to a substrate, such as a lens element or a dome, which has a finite surface curvature.

The planetary method is sometimes further embellished, either for providing more exact uniformity or for coating non-flat surfaces, by locating a leaf-type mask of a suitable profile, between the substrate holder and the vapor source. This mask is typically placed relatively close to the substrate holder, partially shielding the substrate holder from vapor from the source. The mask is arranged such that rotation of the substrate holder about its central axis rotates the substrate holder relative to the mask. This combination mask/planetary method has the disadvantage that a complex mechanism is required to achieve what is essentially a triple-rotation scheme of substrate holder and mask. Such a complex mechanism may be mechanically unreliable at the high temperatures (up to about 400° C.) to which substrates are sometimes heated in deposition of certain coating materials, for example indium tin oxide (ITO). Complex rotating mechanisms are also known to agitate debris in coating apparatus including such mechanisms. This may lead to the inclusion of scattering or defect sites in a deposited layer.

There are several layer deposition applications in which it is required to provide one or more layers which has a thickness which is spatially varied in a predetermined manner. One such application is providing multilayer optical interference device which has an operating wavelength range which varies spatially over a substrate on which the filter is deposited. One example of such a device is a narrow-band filter deposited on a disc shaped substrate, with the transmission wavelength varying with angular position around the disc. This type of device is generally referred to as a circular variable filter (CVF) and may be used in conjunction with a light source, slit, and detector to form a spectrophotometer. The device would require a layer thickness ratio between thickness extremes of about 2:1 to cover even only the visible spectrum.

One method for making this and similar device types is disclosed in U.S. Pat. No. 3,442,572. The method involves depositing coating material on a disc-shaped substrate by the use of first and second masks. The first and second masks and the substrate form three elements, and at least two of the elements are rotated with respect to each other, and to the third element, to cause the material to be deposited on the substrate so that the optical thickness of coating layers varies with azimuthal angle over a segment of the substrate. While elegant in concept, this method requires two masks and the necessary relative rotation of those masks for each substrate to be coated. This makes mass production of such devices by this method a daunting prospect.

Another method of forming layers having a predetermined thickness variation is described, by J. R. Kurdock and R. R. Austin in "*Physics of Thin Films Vol.* 10", pp 261–308, Academic Press (1978). Here, a mask having a spatially varying transmission for coating vapor is placed between a source and a substrate. The mask is prepared by plating a half-tone pattern of metal dots on a wire mesh or wirecloth screen using a complex, computer controlled lithographic process. The mask is essentially "two-dimensional" inasmuch as it is formed from a very thin material and spatially varying layer thickness is achieved by spatially varying the size of areas of the mask through which coating vapor can pass. These areas having a width significantly greater than the thickness of the material.

This method was devised primarily for aspherizing or correcting a surface of an optical element by addition of material to the surface. The description, however, also discloses that layers of spatially variable thickness produced by the method are useful for other applications. Applications include forming a transparent conductive coating having a spatially varying thickness for uniformly heating an irregular shaped window; providing a filter or antireflection coating for a window on which useful light is incident at incidence angles which vary according to the position on the window on which light is incident; and for providing a bandpass filter with a position dependent passband wavelength.

The method has several disadvantages. One disadvantage is that, as described, the mask making process takes several hours. Another disadvantage is that the mesh of the mask is not rigid and must be stretched in a rigid frame to maintain a flatness necessary to ensure uniform spacing of a the mask from a substrate being coated. Further, a preferred wirecloth is formed from 0.0037 inch diameter wires in a 70 mesh weave, which suggests that such a mask would have a maximum vapor transmission of only between about fifty and sixty percent and may become blocked by coating material during deposition of filter having multiple thick layers.

SUMMARY OF THE INVENTION

The present invention is directed to providing a method for vacuum depositing a layer of a material on a substrate. The method comprises causing the material in gaseous form to pass through a three-dimensional mask having a spatially varied transmission for the gaseous coating material in order to impinge on the substrate and condense on the substrate to form the layer. The mask includes a plurality of conduits through which the gaseous form of the material passes to reach the substrate. Each conduit has an angular acceptance for the gaseous form of the material, the angular acceptance of the conduits being inversely related to the length of the conduits. The length of the conduits varies over the mask area in a predetermined manner for controlling spatial variation of thickness of the layer of material deposited on the substrate.

In a preferred embodiment, the method includes rotating the substrate with respect to a source providing the material in gaseous form, with the mask in a fixed spaced-apart relationship with the substrate and extending at least partially over the substrate. The substrate and mask are rotated with respect to the gaseous material source such that gaseous material from the source is incident on essentially any sub-area of the mask at a range of incidence angles depending on the location of the sub-area of the mask, and the rotary path of the sub-area of-the mask with respect to the gaseous material source.

In one preferred example of a mask in accordance with the present invention, the conduits of the mask have essentially identical cross-section form and cross section dimensions, and are aligned parallel to each other and transverse to the area of the mask. Ends of the conduits closest the substrate are preferable equidistant from the surface of the substrate being coated.

The conduits are preferably arranged such that a conduit in a sub-area of the mask through which maximum coating material transmission is required accepts the highest angle of incidence of vapor on the mask. This minimizes the amount of coating material which is prevented from reaching the substrate, thereby optimizing efficiency of the coating process.

A mask in accordance with the present invention is preferably formed from a flat, parallel-sided sheet or slab of a metal "honeycomb" material having elongated hexagonal honeycomb "cells" extending through the slab transverse to surfaces (sides) thereof, from one side to the other. The hexagonal cells have a vertex-to-vertex dimension of about four millimeters (4 mm) and provide the conduits through which gaseous coating material passes.

One surface or side of the slab may be machined to a first surface contour corresponding to a curvature of a substrate or substrate holder, or left flat if the substrate or holder is flat. The opposite surface is machined to a second surface contour which, together with the first surface contour will provide the spatial variation of conduit length required to provide the desired spatial variation of coating thickness.

In addition to providing a layer or multiple layer coatings of spatially varying thickness, the method of the present invention may be used for providing uniform layers on a flat substrate having an area greater than the area that could be uniformly coated employing only single or double rotation methods in the same apparatus. The method of the present invention may also be used for providing a uniform layer or layers on a non-flat surface.

Coating masks suitable for use with the present invention may be quickly and inexpensively produced using computer controlled machining techniques. This combined with planetary rotation of multiple substrate holders provides that even the most complex multilayer filter devices consisting of layers with spatial thickness variation may be made plurally, in a single coating cycle, and at a cost significantly less than is possible using prior art methods.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

As discussed above, the method comprises causing coating material in a gaseous form to impinge on and condense on the substrate, while partially shielding the substrate from the gaseous material, by a mask held in a fixed, spaced-apart position relative to the substrate. The mask is located between the substrate and the gaseous material source and has an area extending at least partially over the substrate. Preferably the substrate and mask are rotated in at least one axis with respect to a source providing the gaseous material It should be noted, here, that the term "gaseous form", or simply "gaseous", is used in a general sense and is intended to encompass any form or mixture of gases, whether dissociated, ionized or neutral, which are condensed on a substrate to form a layer.

In a preferred embodiment the invention is characterized in that the substrate and mask are rotated with respect to the gaseous material source such that gaseous material from the source is incident on essentially any sub-area of the mask at a range of incidence angles depending on the location of the sub-area of the mask, and the rotary path of the sub area with respect to the gaseous material source. The mask includes a plurality of conduits through which the gaseous form of the material passes to reach the substrate.

Two rotation arrangements are preferred for achieving the range-of-incidence-angles condition which cooperates with the mask of the present invention to provide variable layer thickness. These arrangements are well-known to practitioners of the art and have been used with other forms of mask discussed above, nevertheless, a review of important features of these rotation schemes is presented below to facilitate understanding how the mask of the present invention functions.

Figure 1:
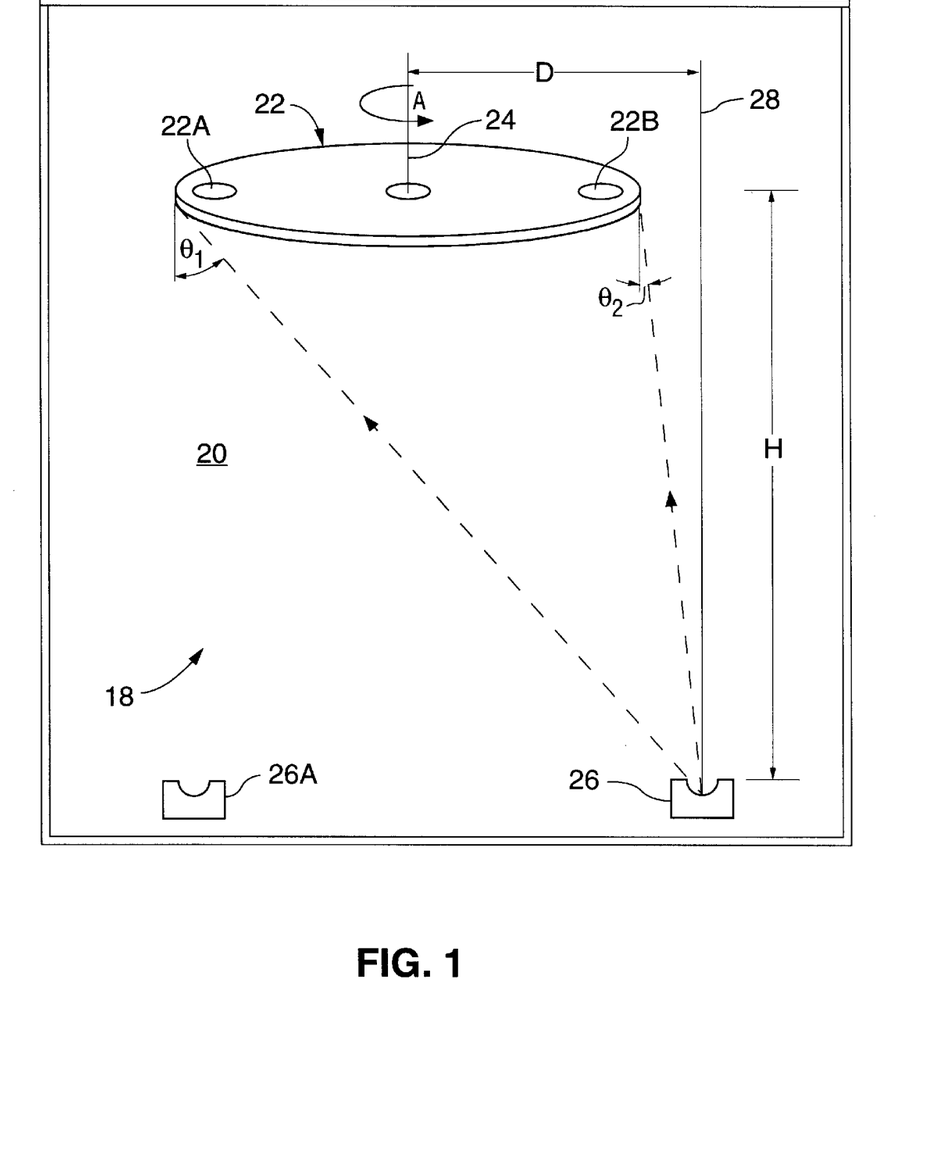
FIG. 1 is a partial perspective view, schematically illustrating a prior art thermal-evaporation coating layer deposition apparatus including an offset single-rotation substrate holder and an evaporation source.

Turning now to the drawings, wherein like components are designated by like reference numerals, FIG. 1 illustrates a first preferred rotation scheme 18. In scheme 18, an evacuable chamber 20 encloses a substrate holder 22 which is arranged to rotate about a central axis 24 as indicated by arrow A. Substrate holder 22 is located at a vertical distance (height) H above at least one source 26 for providing gaseous coating material. At least one additional source 26A may be provided, as illustrated. This source may be used sequentially with source 26 for providing alternating layers of different materials, or used simultaneously with source 26 for co-depositing separate component materials of a single layer. Rotation axis 24 of the substrate holder is offset by a distance D from a vertical (symmetry) axis 28 through source 26A. Source 26A is preferably similarly located with respect to substrate holder 22.

Those familiar with the optical coating art will recognize that spatial distribution of film thickness over substrate holder is a function primarily of height H, offset D, the diameter of substrate holder 22, and the angular emission characteristics of gaseous coating material from source 26. Source 26 may be any source, including, but not limited to, a resistance heated source, electron beam heated source, or a plasma activated source such as a sputter-gun. In relatively low vacuum depositions, such as might be encountered in reactive deposition, spatial thickness variation may additionally be dependent on pressure in chamber 20.

Gaseous material from source 26 is incident on substrate holder 22 at a maximum angle of incidence $\theta_1$ and a minimum angle $\theta_2$. At an instant during rotation of substrate holder 22, gaseous material will be incident on a sub-area 22A of the substrate holder 22 at angles close to the maximum angle, and will be incident on sub-area 22B at angles close to the minimum angle. At a following instant, when substrate holder 22 has rotated 180 degrees, the opposite will be true. As substrate holder 22 rotates at least once, and typically many times, during the deposition of a layer, it can be seen that essentially any sub-area of the substrate holder will receive gaseous coating material at a range of incidence angles, between $\theta_1$ and $\theta_2$, depending on its position on the substrate holder. The range of angles received by the sub area will of course be less, the closer that sub-area is to rotation axis 24 of the substrate holder. The terminology "essentially any", here, is used in recognition that, in theory at least, an infinitesimally small area on axis 24 will receive gaseous material at only one angle of incidence.

Figure 2:
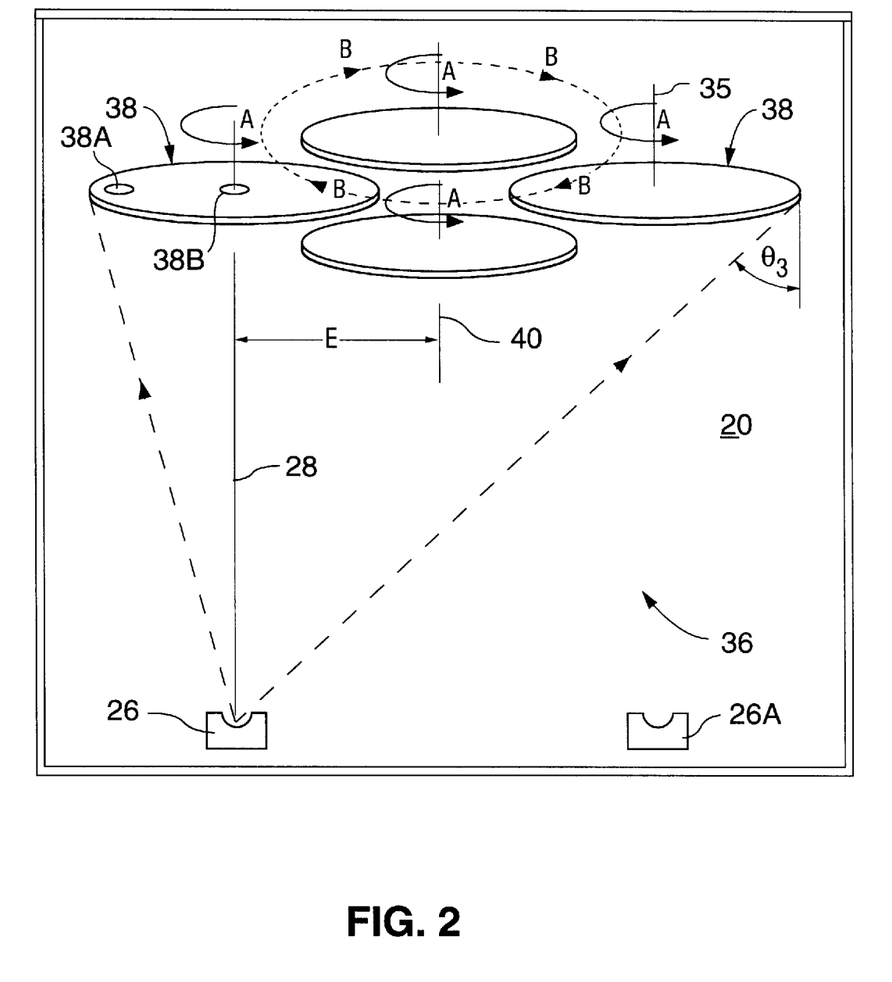
FIG. 2 is a partial perspective view, schematically illustrating a prior art thermal-evaporation coating layer deposition apparatus including a plurality of double-rotation or planetary substrate holders and two evaporation sources.

Referring now to FIG. 2, a second rotation arrangement 36 for achieving the range-of-incidence-angles condition important in the method of the present invention is illustrated. Rotation arrangement 36 is usually referred to by practitioners of the optical coating art as a double-rotation or planetary rotation arrangement. Rotation arrangement 36 includes four substrate holders 38, each thereof rotated about a central axis 35 thereof as indicated by arrow A, and additionally rotated about a centrally-therebetween located axis 40 as indicated by arrows B. It should be noted here that four substrate holders are illustrated merely by way of example, as the arrangement is effective with more or less substrate holders, and even with only one substrate holder.

Substrate holders 38 are located above an evaporation source 26, here, offset by a distance E from rotation axis 40. At least one other source 26A may also be provided for reasons discussed above. Any non-centrally located sub-area 38A of a substrate holder 38 describes a spiral path around chamber 20. A centrally located sub-area 38B can not be exactly described as following a spiral path, nevertheless, even an infinitesimally small central sub-area in this rotation scheme receive coating at a range of incidence angles as it rotates around the chamber. Any sub-area of any substrate holder 38 receives gaseous material from source 26 at a range of incidence angles. The maximum possible incidence angle in arrangement 36 is $\theta_3$. The minimum possible incidence angle is normal (zero) incidence as when a substrate is located directly over source-axis 28.

The planetary rotation arrangement of FIG. 2 can provide superior layer thickness uniformity and repeatability over a substrate holder than the single rotation arrangement of FIG. 1. This is due at least in part to the fact that dual rotation of the substrate holders 38 tends to compensate for any asymmetric output characteristic of source 26.

It should be noted here that while single and double-rotation arrangements 18 and 36 have been illustrated with substrate holder rotation axes thereof parallel to source axis 28 of gaseous material source 26, the substrate holders' axes may be inclined either away from or toward the source axis without compromising effectiveness of the present invention. Such inclination of the substrate holder rotation axis is often used in double-rotation arrangement 36, for example, to provide uniform coating thickness over a non-flat lens element.

Figure 3:
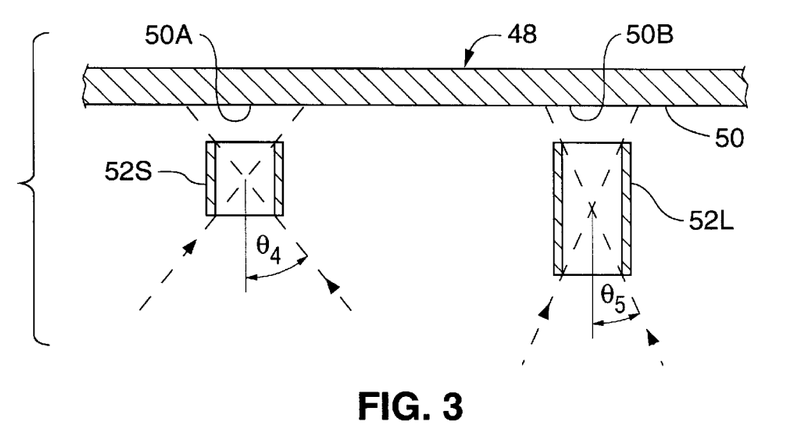
FIG. 3 is a general cross-section view schematically illustrating operating principles of a variable transmission mask in accordance with the present invention.

Referring now to FIG. 3 an important principle of the mask of the present invention is illustrated. Here a section 48 of a flat substrate is shown, it being assumed that substrate section 48 is being held in a substrate holder in either arrangement 18 or 36. Suspended below surface 50 of substrate 48 and spaced-apart therefrom (by means not shown) are short and long tubes or conduits 52S and 52L (shown in cross-section) respectively, each tube having the same diameter. Short tube 52S, controls deposition on sub-area 50A of substrate surface 50, and is able to accept gaseous coating material at any incidence angle up to a maximum acceptance angle of $\pm\theta_4$. Long tube 52L controls deposition on sub-area 50B of substrate surface 50, and is able to accept gaseous coating material at any incidence angle up to a maximum acceptance angle of $\pm\theta_5$ where $\theta_5 < \theta_4$. Were substrate 48 arranged such that, in the absence of tubes 52S and 52L, sub areas 50A and 50B would receive the same amount of gaseous coating material to provide the same coating layer thickness in those sub-areas. In the presence of the tubes, the ratio of layer thickness in subareas 50A and 50B would related directly to the ratio $\theta_4:\theta_5$, i.e., inversely related to the length of tubes 52S and 52L.

Figure 4:
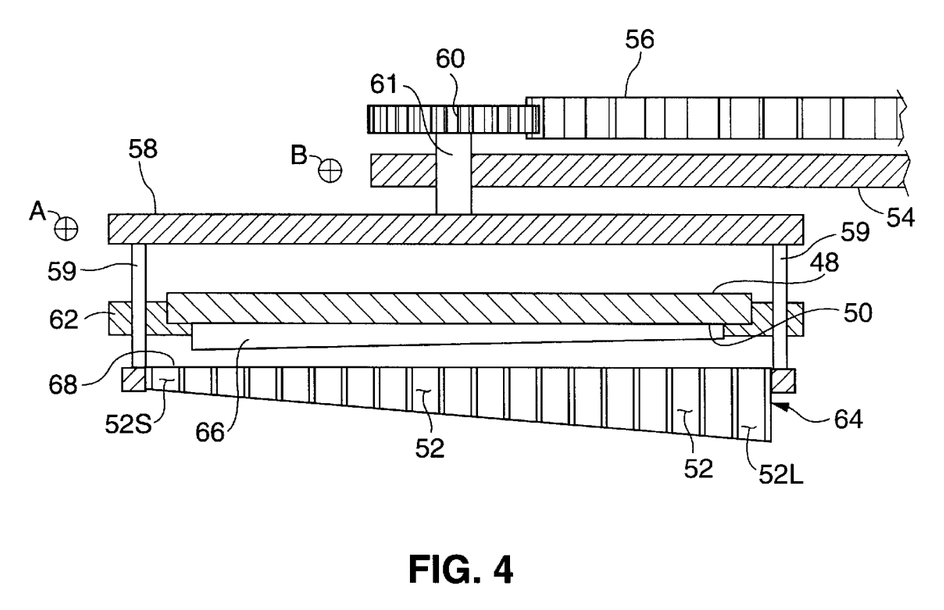
FIG. 4 is a general cross-section view schematically illustrating a double-rotation or planetary drive arrangement including a substrate holder, a substrate, and a variable-transmission mask in accordance with the present invention.

A preferred planetary drive arrangement using a mask in accordance with the present invention is illustrated in FIG. 4. Here, a planet support 54 having a main drive gear 56 is rotated about an axis (not shown) to provide rotary motion B of FIG. 2. Suspended from support 54 is a planet 58 which is driven by a gear 60 meshing with gear 56 and a drive shaft 61 to provide rotary motion A of FIG. 2. Suspended from planet 58 by bolts 59 is a substrate holder 62 in which substrate 48 is located. Also suspended from planet 58 by bolts 52 is a mask 64. Mask 64 is retained, by this mounting method, in a fixed relationship to substrate 48, and extends over the entire surface of the substrate. The mask and substrate are rotated by planet 58 as the planet is rotated.

Mask 64 includes a plurality of contiguous conduits 52 extending therethrough from one side thereof to the other for permitting passage of gaseous coating material through the mask. The conduits are of various lengths continually graded from a shortest 52(S) to a longest 52(L) thereof. The conduits are arranged such that gaseous coating material can only pass through the mask via the conduits. In a preferred method of using mask 64, planet 64 would be arranged with respect to a source or sources (not shown) of gaseous coating material, such that, in the absence of mask 64, a layer of about uniform thickness would be deposited on surface 50 of substrate 48. In such a case, positioning of mask 64 as shown would provide a layer 66 having a thickness graded in an inverse relationship to the length gradation of conduits 52 of mask 64 in the plane illustrated in FIG. 4.

The length thickness relationship may vary according to the source type used to provide gaseous coating material and the geometrical arrangement of a drive. A relationship can be quickly determined either mathematically or by simple experiment.

Preferably, conduits 52 have a diameter (or maximum dimension for non-circular cross-sections) of between about 0.5 and 5.0 mm. Preferably, but not necessarily the mask is arranged such that conduits 52 have corresponding ends thereof aligned in the same plane 68. Plane 68 is preferably arranged parallel to plane 50 of substrate 48 and at a distance between about 5.0 and 50.0 millimeters (mm) therefrom. If a mask is spaced from the substrate by a distance about equal to a conduit diameter (maximum cross-section dimension) or less, an "impression" of individual conduits may appear in a deposited layer. A preferred spacing is about ten times the conduit diameter (maximum cross-section dimension). In this spacing a sub-area on the substrate having an area equal to the cross-section area of a conduit receives gaseous coating material from two or more adjacent conduits. This smooths the grading of layer thickness, rendering the conduit pattern essentially undetectable.

A further measure to prevent detectability of the conduit pattern involves back filling chamber 20 with a suitable gas during deposition of coating materials. When depositing oxide materials, for example, titanium dioxide and fused silica, which are commonly used in production of dichroic filters and the like for the visible region of the electromagnetic spectrum, oxygen is preferably introduced into the chamber. When depositing materials other than oxides, for example magnesium fluoride, an inert gas such as argon may be introduced into chamber 20. When introducing oxygen or any other gas into the chamber a pressure of about $5 \times 10^{-4}$ millibar is preferably maintained therein. This allows a mask to be located closer to the substrate than would be possible without introducing gas.

Referring now to FIGS. 5, 6, 7, and 8, one convenient method of making a variable transmission mask in accordance with the present invention, suitable for depositing a circular variable filter by the method of the present invention is illustrated. The circular variable filter is required to have a characteristic wavelength, such as a passband wavelength in a bandpass filter, or a cut-on or cut-off wavelength in a dichroic filter, which varies with (azimuthal) angular position around the filter. The mask is formed from a parallel-sided block 70 of a "honeycomb" material having upper and lower sides 71 and 73 respectively. Hexagonal-shaped "cells" 74 of the material will form conduits 52 of the finished mask. One preferred honeycomb material, made from aluminum, and having hexagonal cells of about 4.0 mm maximum cross-section dimension, is a available from Hexcell Inc. of Pleasanton, Calif. This cell size is sufficiently large that a mask may be used many times before blockage of cells by condensed coating material significantly affects performance of the mask.

Figure 8:
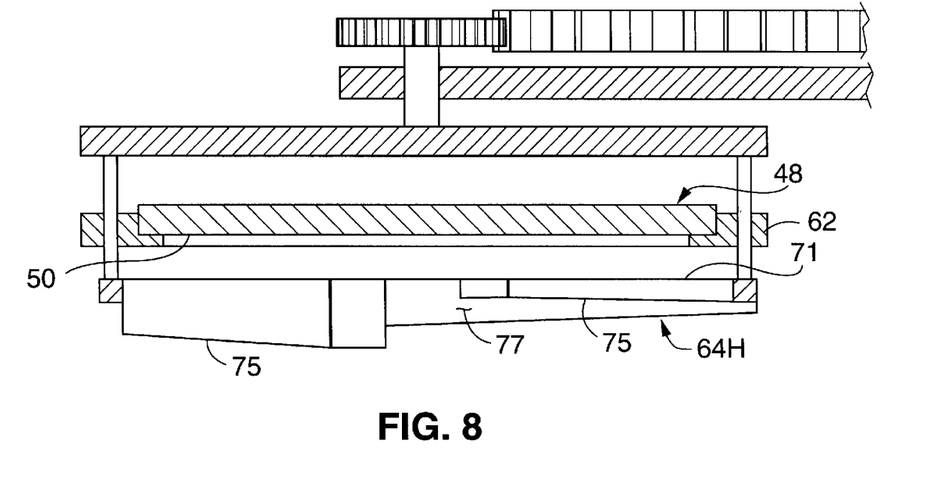
FIG. 8 is a partial cross section view schematically illustrating location of the mask of FIG. 7 with respect to a substrate to be coated through the mask, the mask and substrate being located in the planetary drive arrangement of FIG. 4.

Block 70 is formed into an annular segment shape (see FIG. 5), having a central axis 76. Side 71 of block 70 is then cut or machined such that cells have length linearly varying with angular position $\bar{\omega}$. The machined side of finished mask 64H thus has a surface form which may be defined as generally helicoid. This is illustrated in FIG. 6, as surface 75, lines shown in FIG. 6 on the generally helicoid surface being representative of surface contour rather than illustrating the hexagonal form of cells shown in FIG. 5. In use, mask 64H is located with side 71 of original honeycomb block 70 facing surface 50 of substrate 48 and machined surface 75 of mask 64H furthest from substrate 48 as illustrated in FIG. 8.

Figure 5:
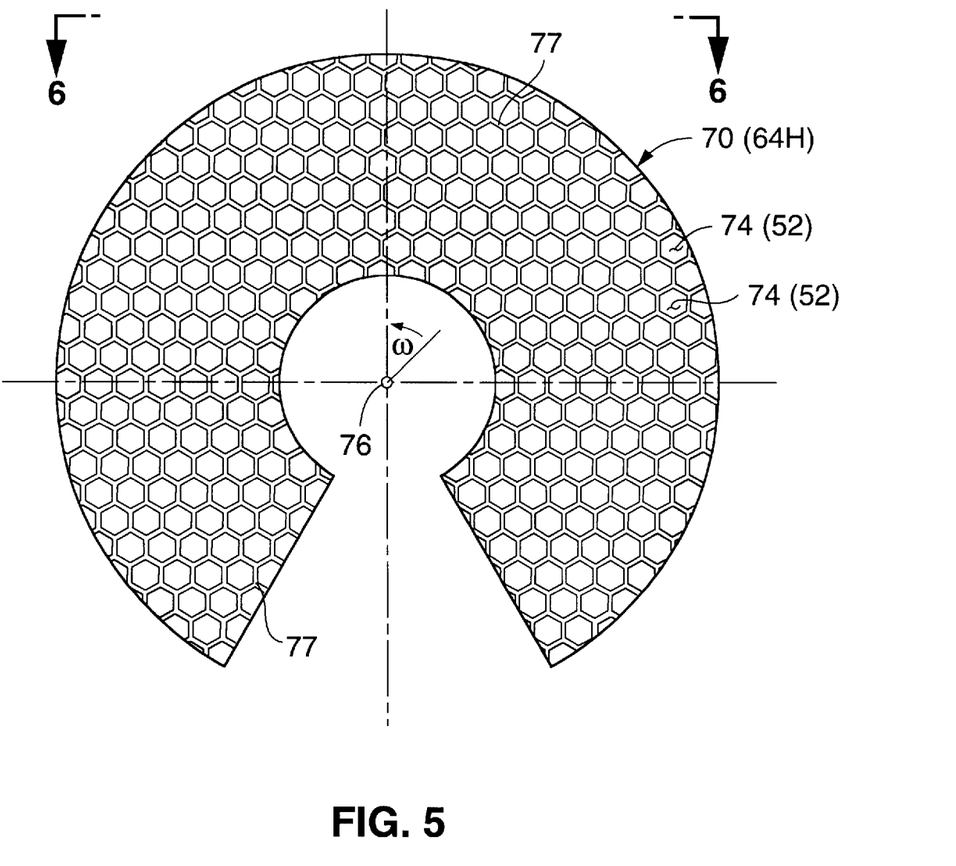
FIG. 5 is a plan view schematically illustrating an annular-segment-shaped block of a honeycomb material for forming a variable-transmission mask in accordance with the present invention, suitable for making a circular variable filter.
Figure 6:
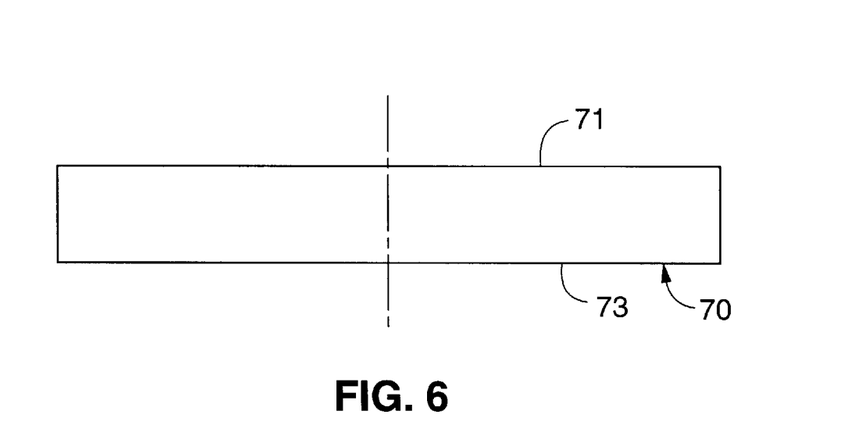
FIG. 6 is an elevation view of the honeycomb material block of FIG. 5 seen generally in the direction 6—6 of FIG. 5.
Figure 7:
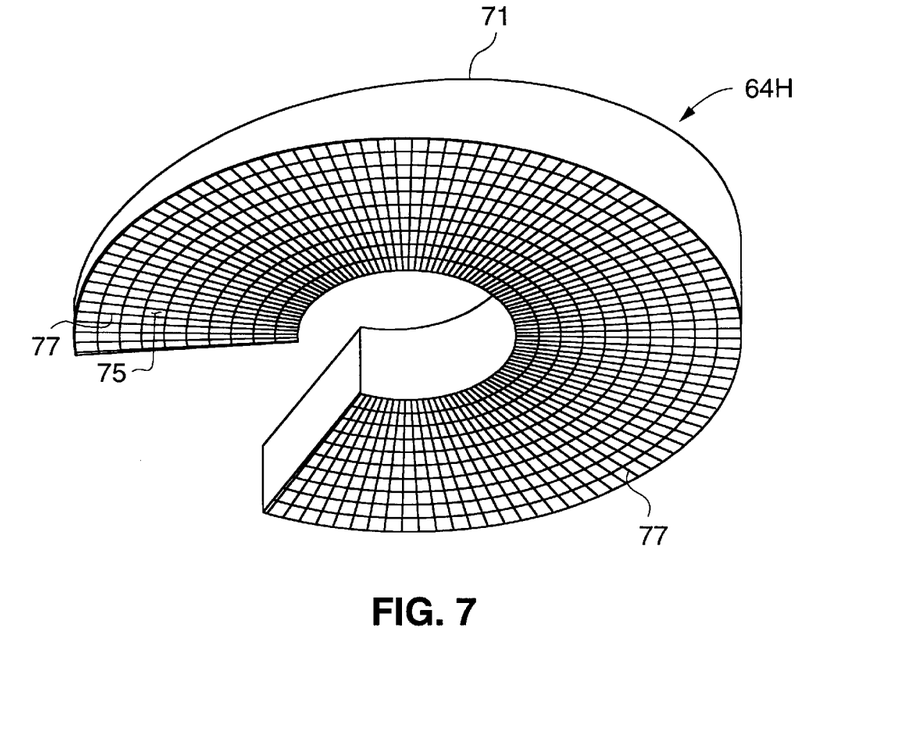
FIG. 7 is a perspective view of a mask formed from the honeycomb material block of FIG. 5 having a flat rear surface and a helicoidal front surface.
Figure 9:
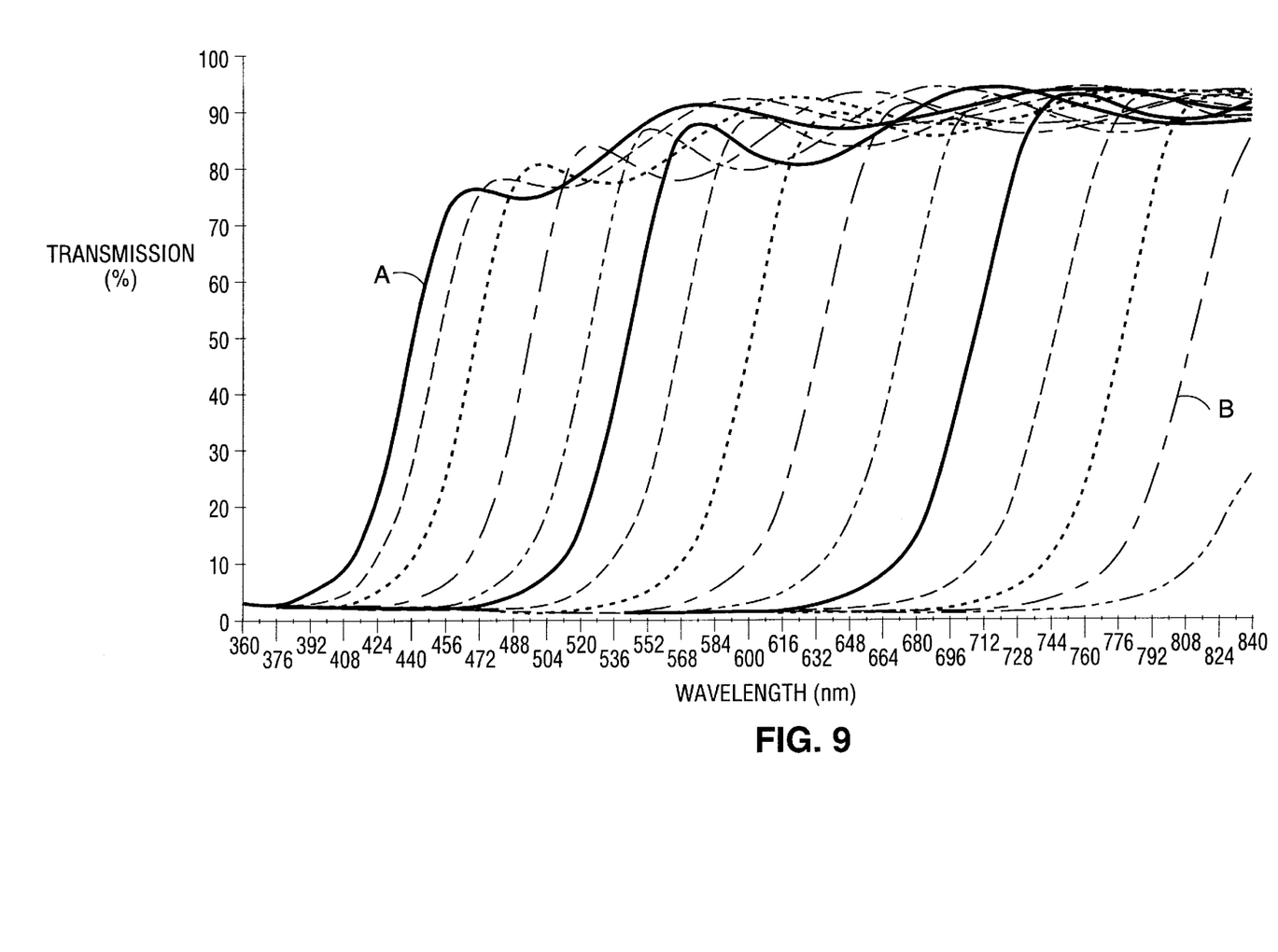
FIG. 9 is a graph showing cut-on edge wavelength as a function of angular position in a segment of a circular variable dichroic filter deposited via a variable transmission mask in accordance with the present invention.

FIG. 9 depicts measured transmission as a function of wavelength at various azimuthal positions on a segment of a circular variable dichroic filter deposited through a mask of the form depicted in FIGS. 5 and 6. Curves A and B of FIG. 9 represent measurement positions separated by 260° of azimuth. Intermediate curves are measured at 20° intervals. The mask has a 188 mm overall diameter, a cell width of 4.76 mm, a cell wall thickness 0.25 mm, a minimum cell length of 4.0 mm and a maximum cell length of 10.5 mm. Cell length varies linearly with azimuthal position. The mask was located about 38 mm from the filter substrate during deposition. This distance may be reduced to 28 mm if gas is introduced into the chamber as discussed above. The filter had a functional annulus outer diameter of 140 mm, a functional annulus width of 32 mm, and a functional arc of about 300°.

Layers of the filter were alternating layers of magnesium fluoride and zinc sulfide. The magnesium fluoride was evaporated from an electron-beam gun source. The zinc sulfide was evaporated from a resistance heated source. The substrate was held in a planetary fixture having a 290 mm orbit radius. Source to substrate height was about 700 mm. The electron-beam and resistance heated source were offset respectively 210 mm and 245 mm from the planetary orbit axis.

It is pointed out here, that wavelength locations of the cut-on edge positions of the response curves of FIG. 9 do not correspond exactly to an inverse linear relationship of layer thickness and conduit length. For example, a quadratic fit to the relationship shows a second order coefficient of about 0.1. However, when a honeycomb mask is fabricated as discussed above by numerically controlled machining of a block of honeycomb material, it is a relatively simple matter to correct the mask for any such slight divergence from linearity (or any other desired relationship) in a subsequent machining step, or by generating a new mask with conduit lengths pre-corrected to compensate for the divergence from linearity (or any other desired relationship).

Conduits of masks 64 in accordance with the present invention have been described as being equal in diameter or maximum cross-section dimension. This should not be construed as limiting. Those skilled in the art may recognize applications in which variation in conduit diameter may be used in conjunction with variation in conduit length to achieve a particular transmission characteristic of a mask. Whether or not conduits have the same diameter, however, it is preferable, although not essential, that the cross sectional form of the conduits be at least biaxially symmetrical and most preferably as close to circular as possible, such that angular acceptance characteristics of a conduit are substantially the same whatever its orientation with respect to a source of gaseous coating material. The hexagonal form illustrated in FIG. 5 provides an adequate approximation to roundness while allowing for optimal packing of conduits and limiting obscuration due to wall thickness of the conduits.

The forgoing description has been directed to masks designed for use with a flat substrate, for providing a layer or layers having a graded thickness. The method however is also applicable to providing a uniform layer on a steeply curved surface, or a uniform layer on a flat surface whereon, because of substrate size or apparatus size restrictions, a uniform layer could not be deposited solely by rotary motion, or combination of rotary motions, of the substrate.

In the either case, it is simply necessary to determine, mathematically or practically, a gradation of layer thickness on the substrate which occurs with a particular rotary arrangement in the absence of a mask, and then construct a mask in accordance with the present invention, which, when used in combination with that rotary arrangement as described above, would modify that gradation such that a layer or layers of uniform thickness could be obtained.

Figure 10:
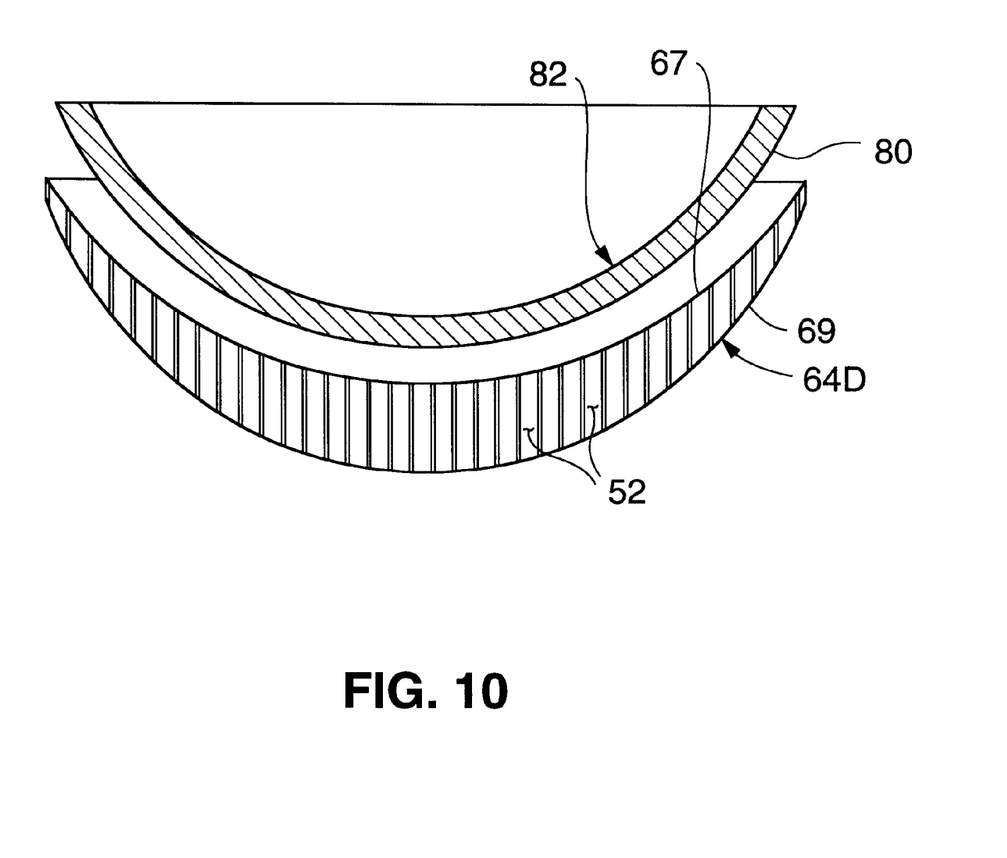
FIG. 10 is a general cross-section view showing a dome-shaped substrate and a dome-shaped variable transmission mask in accordance with the present invention for depositing a uniform thickness layer on the convex surface of the dome-shaped substrate.

By way of example, FIG. 10 schematically illustrates one general form of a mask 64D in accordance with the present invention for providing a uniform layer or layers on a convex surface of a dome-shaped substrate 82. In most single or double rotation deposition arrangements, in the absence of a mask, a layer deposited on surface 80 would have a thickness near the center of the surface significantly greater than the thickness near the edge. Accordingly, mask 64D is arranged to shield the center of the surface from coating material more than the edge of the of the surface. This is achieved by grading the length of conduits 52 extending through the mask, from a longest 52(L) at the center of the mask to a shortest 52(S) around the edge of the mask. The gradation of conduit length is selected such a uniform layer is deposited on surface 80. Preferably, conduits 52 are arranged such that ends thereof closest substrate 80 are equidistant from surface 80. Mask 64D may be formed from a block of honeycomb material as described above. In this case, however, both sides of the block would be machined to provide opposite curved sides and 69 of the mask.

Figure 11:
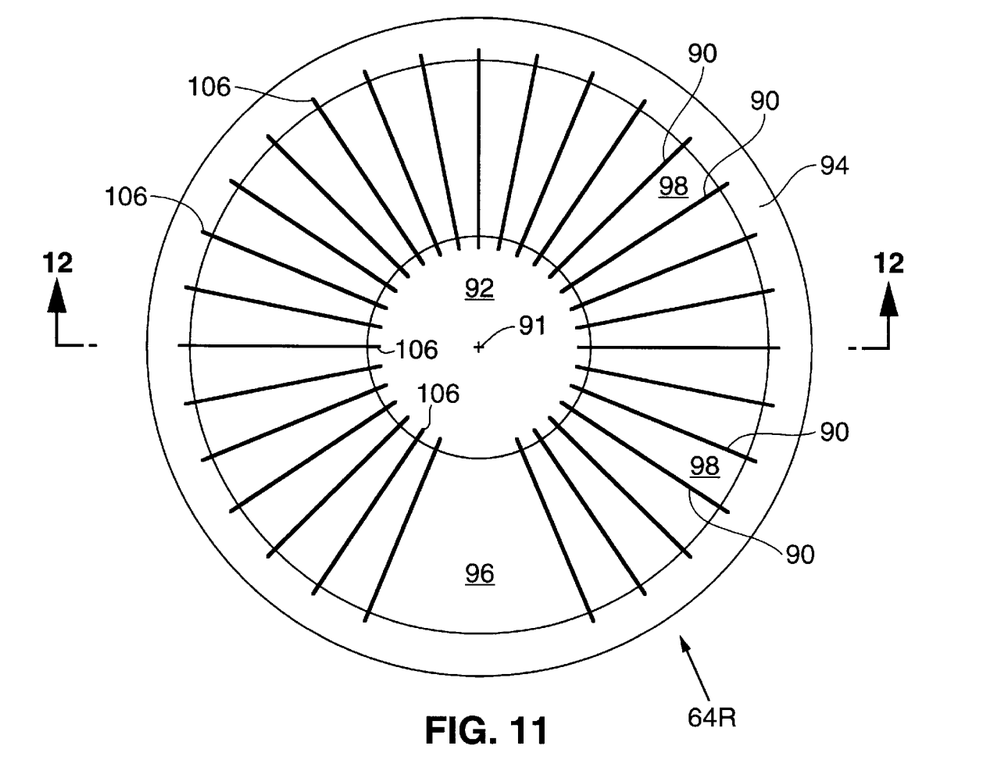
FIG. 11 is a plan view from above schematically illustrating another embodiment of a variable-transmission mask suitable for making a circular variable filter and having radially-arranged walls or blades providing segments of the mask with different angular acceptance for gaseous material.
Figure 12:
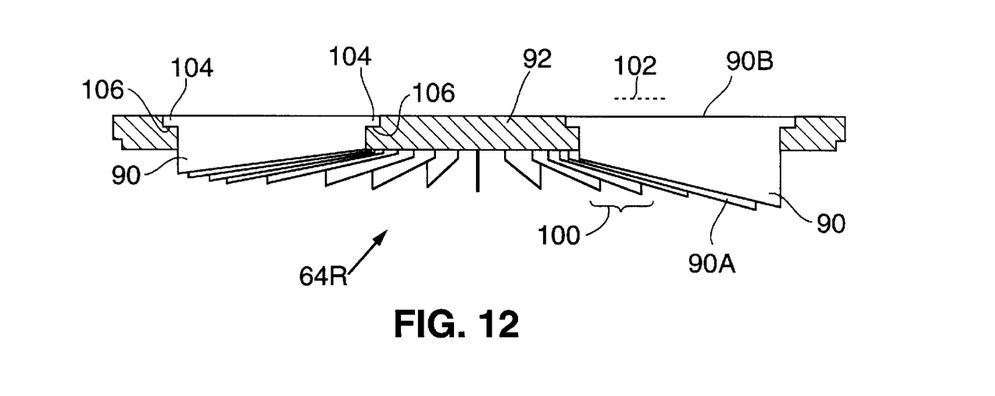
FIG. 12 is a cross-section view seen generally in the direction 12—12 of FIG. 11.

Referring now to FIG. 11 and FIG. 12, still another embodiment 64R of a three-dimensional mask in accordance with the present invention is depicted. Mask 64R is particularly suited for the manufacture of above-described circular variable filters. Mask 64R includes a plurality of radially oriented walls or blades 90 extending between a central "hub" member 92 and a peripheral "rim" member 94.

Hub portion 92 and rim portion 94 are rigidly connected by a segment-shaped connecting-member 96. Connecting member 96 completely masks a portion of a substrate (not shown in FIGS. 11 and 12) being coated and may define extremities of the functional-arc of a circular variable filter being deposited on the substrate using the mask.

Blades 90, together with hub, rim and connecting members of mask 64R segment the mask into a plurality of elongated radially extending apertures or zones 98 through which gaseous coating material can pass. The height of adjacent blades and the spacing therebetween at any point or subarea of the mask defines the angular acceptance of the mask at that point for gaseous coating material. A preferred angular spacing of blades 90 is between about three and six degrees.

As depicted in FIG. 12, mask 64 is formed from preshaped blades mounted between hub portion 92 and rim portion 94. Front edges 90A of the blades generally lie on a generally helicoidal "surface" 100 similar to above-described mask 64H of FIG. 7. Rear edges 90B of blades 90 are aligned in the same plane 102. Blades 90 have a key portion 104 at each end thereof. Key portions 104 engage corresponding slots 106 in hub and rim portions 92 and 94 of mask 64R. These slots may be conveniently formed by spark erosion. Mask 64R is preferably used with surface 96 toward a source of gaseous coating material. As hub and rim portions 94 are rigidly connected and held concentric by connecting member 96, blades 90 are not required to function as connecting members or "spokes". This provides that blades 90 can be removably suspended in slots 104 which in turn provides that any "fine-tuning" or correction of a mask 64 can be effected by replacing or reshaping individual blades 90.

The mask assembly arrangement of FIG. 11 and 12 is but one possible assembly arrangement. Those skilled in the mechanical arts may devise other assembly arrangements while still retaining the inventive segmented aperture arrangement of the mask.

The form of mask 64 is useful only in arrangements wherein the mask and a substrate partially obscured by the mask are rotated with respect to a source of gaseous coating material. One advantage of the segmented aperture mask form compared for example with the "honeycomb" form of mask 64H (see FIG. 7) is that a lesser proportion of the mask is obscured by the thickness of dividing walls or blades. This permits a higher overall rate of deposition of coating material on the substrate using then same deposition arrangements. The higher deposition rate provides for shorter manufacturing cycles. A mask 64R can transmit about two times as much coating material as a honeycomb mask 64H providing the same distribution profile.

In one example of mask 64R suitable for providing the above-described exemplary circular variable filter performance of FIG. 9, the mask has a 230.0 mm overall diameter, a functional annulus width of 90.0 mm, a functional annulus outer diameter of 216.0 mm, and a functional arc of about 330.0°. The mask is preferably located with flat side 102 thereof at about 28.0 mm from the filter substrate during deposition. There are one-hundred-eight (108) blades or walls 90, radially separated by 3°. The walls have a thickness of about 0.25 mm. The height of any wall varies in direct proportion to distance from central point 91 of the mask, and the height of walls around any radius of the functional arc is varied about linearly between a highest value required for a shortest transmission wavelength and a lowest value required for a maximum coating wavelength. This results, for any aperture or zone 98, in a generally constant ratio of height to physical spacing of adjacent walls 90. This provides for essentially-equal angular acceptance for gaseous coating material anywhere in a particular aperture or zone 98.

Figure 13:
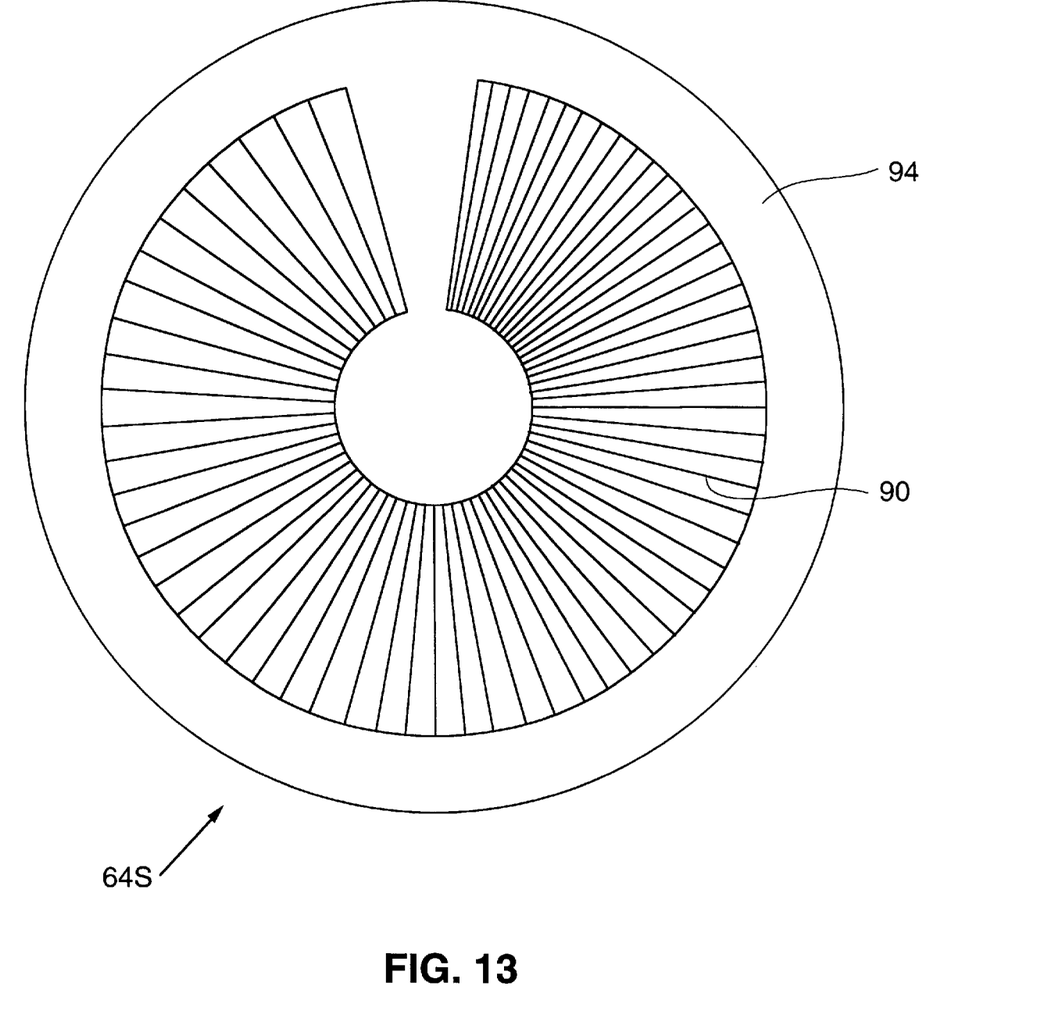
FIG. 13 is a plan view from above schematically illustrating another embodiment of a variable-transmission mask suitable for making a circular variable filter and having radially-arranged blades wherein the spacing of the blades is varied.

The above-described arrangement of mask 64R in which blades 90 are angularly equally-spaced should not be considered limiting. Those skilled in the art will recognize without further illustration the a mask having a similar function may have all blades 90 being the same height around any arc about central point 91 of the mask, height of each wall varying in direct proportion to distance from central point 91 of the mask, but with walls being progressively, increasingly angularly-spaced from a minimum angular-spacing to a maximum angular spacing. A mask 64S formed in accordance with these parameters is shown in FIG. 13. Similarly, certain spacial distribution profiles may be achieved by a combination of blade-height variation and angular-spacing variation.

It will be appreciated from the foregoing description and corresponding illustrations that a graded transmission mask in accordance with the present invention may be described as "three-dimensional" inasmuch as it has a significant thickness compared with its area and gradation of this thickness provides gradation of conduit length. Nevertheless, the mask may be quickly and inexpensively produced from commercially-available metal honeycomb material by conventional computer controlled machining methods.

The method of the present invention may be used for any application in which layer thickness control is required either for providing uniform layers or layers with layer thickness spatially varied in a predetermined way. Such applications include, however, are not limited to: correction or apspherizing optical surfaces; deposition of antireflection coatings or filter coatings (whether in the visible region or some other region of the electromagnetic spectrum) having spectral characteristics spatially varied over a surface in a predetermined manner, such as narrow band filters bandpass and edge filters, polarizers, and variable attenuators; deposition of conductive layers or conductive-layer containing devices having resistivity varied in a predetermined manner; or deposition of uniform coatings on steeply curved surfaces.

The present invention has been described and depicted, in terms of a preferred and other embodiments. The invention is not limited, however, to those embodiments described and depicted. Rather the invention is defined by the claims appended hereto.

What is claimed is:

1. A method for vacuum depositing a layer of a material on a substrate, the method comprising causing the material in a gaseous form to impinge on and condense on the substrate, while rotating the substrate with respect to a source providing the material in gaseous form, and while partially shielding the substrate from the gaseous material by a mask held between the substrate and the gaseous material source, the mask having an area extending at least partially over the substrate, the invention characterized in that:

the substrate and mask are held in a fixed spaced-apart relationship to each other and rotated together in the same rotational path with respect to the gaseous material source such that gaseous material from the source is incident on any sub-area of the mask at a range of incidence angles depending on the sub-area of the mask and the rotary path of the sub-area with respect to the gaseous material source;

the mask includes a plurality of radially-extending spaced-apart walls, said walls dividing the mask into a plurality of elongated radially-extending apertures through which the gaseous material passes to reach the substrate, the angular acceptance of a said aperture for the gaseous material at any location therein being inversely related to the height and spacing of adjacent said dividing walls, and the amount of gaseous coating material transmitted by an aperture at said any location being directly related to said angular acceptance thereat; and at least one of the height and angular spacing of said dividing walls is varied over the mask area in a predetermined manner for controlling the thickness of a layer of material deposited on the substrate.

2. The method of claim 1, further characterized in that said dividing walls have equal angular-spacing and the height of said dividing walls is varied over the mask area.

3. The method of claim 2, further characterized in that each of said dividing walls has a height varying in direct proportion to the distance therealong from a central point of the mask.

4. The method of claim 3 further characterized in that on any arc around said central point of the mask, the height of said dividing walls progressively increases from one thereof to the next.

5. The method of claim 1, further characterized in that each of said dividing walls has the same dimensions and said angular-spacing is varied.

6. The method of claim 5, further characterized in that each of said dividing walls has a height varying in direct proportion to the distance therealong from a central point of the mask.

7. A method for vacuum depositing a layer of a material on a substrate, the method comprising causing the material in a gaseous form to impinge on and condense on the substrate, while partially shielding the substrate from the gaseous material by a mask held between the substrate and a gaseous material source, the mask having an area extending at least partially over the substrate, the invention characterized in that:

the gaseous material source is a thermal-evaporation source;

the mask and the substrate are held in a fixed spaced-apart relationship to each other and rotated together in the same rotational path with respect to the gaseous material source;

the mask includes a plurality of conduits extending from one side thereof to the other, through which the gaseous form of the material passes to reach the substrate; and the length of the conduits is varied over the mask area in a predetermined arrangement for controlling spatial variation of the thickness of the layer of material deposited on the substrate.

8. The method of claim 7, the method further characterized in that the evaporation source is an electron-beam heated source.

9. The method of claim 8, the method further characterized in that the evaporation source is a resistance-heated source.

* * * * *